(12) United States Patent
Schriel et al.

(10) Patent No.: US 10,743,408 B2
(45) Date of Patent: Aug. 11, 2020

(54) ARRAY TYPE DISCRETE DECOUPLING UNDER BGA GRID

(71) Applicant: ALCATEL-LUCENT CANADA INC., Ottawa (CA)

(72) Inventors: James M. Schriel, Ontario (CA); Alex L. Chan, Ontario (CA); Paul J. Brown, Quebec (CA)

(73) Assignee: Alcatel Lucent, Boulogne-Billancour (FR)

( * ) Notice: Subject to any disclaimer, the term of this patent is extended or adjusted under 35 U.S.C. 154(b) by 0 days.

(21) Appl. No.: 15/961,098

(22) Filed: Apr. 24, 2018

(65) Prior Publication Data

US 2018/0242447 A1 Aug. 23, 2018

Related U.S. Application Data

(62) Division of application No. 15/184,662, filed on Jun. 16, 2016, now abandoned.

(51) Int. Cl.
| | |
|---|---|
| *H05K 1/02* | (2006.01) |
| *H05K 1/11* | (2006.01) |
| *H05K 1/18* | (2006.01) |
| *H05K 3/00* | (2006.01) |

(52) U.S. Cl.
CPC .......... *H05K 1/0296* (2013.01); *H05K 1/111* (2013.01); *H05K 1/181* (2013.01); *H05K 3/0005* (2013.01); *H05K 1/113* (2013.01); *H05K 1/114* (2013.01); *H05K 2201/10704* (2013.01); *H05K 2201/10712* (2013.01); *H05K 2201/10719* (2013.01); *H05K 2201/10734* (2013.01); *Y02P 70/611* (2015.11)

(58) Field of Classification Search
CPC .... H05K 1/0296; H05K 1/111; H05K 3/0005; H05K 1/181; H05K 1/113; H05K 1/114
USPC ........................................................ 174/262
See application file for complete search history.

(56) References Cited

U.S. PATENT DOCUMENTS

| | | | |
|---|---|---|---|
| 7,602,615 | B2 | 10/2009 | Chan et al. |
| 2002/0195269 | A1 | 12/2002 | Pearson et al. |
| 2005/0128721 | A1 | 6/2005 | Tay et al. |
| 2012/0168216 | A1 | 7/2012 | Chan |

*Primary Examiner* — Tremesha S Willis
(74) *Attorney, Agent, or Firm* — Kramer Amado, P.C.

(57) ABSTRACT

Various exemplary embodiments relate to a printed circuit board (PCB) for electrically connecting a discrete array component including a pattern formed on the PCB which is a merger of a set of via pads and a discrete array component; wherein the pattern is generated by a pin mapping between the discrete array component and a via grid array on the PCB; and wherein the pattern is formed of a metal etched during a manufacturing process of the PCB.

11 Claims, 5 Drawing Sheets

ARRAY TYPE DISCRETE DECOUPLING UNDER BGA GRID

CROSS REFERENCE TO RELATED APPLICATIONS

This application is a divisional application of U.S. patent application Ser. No. 15/184,662 filed Jun. 16, 2016, which is hereby incorporated by reference for all purposes as if fully set forth herein.

TECHNICAL FIELD

Various exemplary embodiments disclosed herein relate generally to circuit board pad design.

BACKGROUND

A land grid array (LGA) is a type of surface-mount packaging (a chip carrier) used for integrated circuits. LGA packages are used to permanently mount devices such as microprocessors. A LGA can provide more interconnection pins than can be put on a dual in-line or flat package. The whole bottom surface of the device can be used, instead of just the perimeter. A ball grid array (BGA) is a specific type of LGA that uses solder balls to facilitate the connection between the device and a circuit board.

SUMMARY

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a printed circuit board (PCB) for electrically connecting a discrete array component comprising: a pattern formed on the PCB which is a merger of a set of via pads and a discrete array component; wherein the pattern is generated by a pin mapping between the discrete array component and a via grid array on the PCB; and wherein the pattern is formed of a metal etched during a manufacturing process of the PCB.

Various exemplary embodiments relate to a computer aided design (CAD) tool implemented on a computing device for soldering a discrete array component on a printed circuit board (PCB) for use with mounting a component comprising: a design tool mode configured to identify a placement of the discrete array component on the PCB and to verify whether pin mapping between the discrete array component and a ball grid array (BGA) on the opposite side of the PCB is feasible; a design tool mode configured to determine the geometry of a set of via pads to be associated with the discrete array component and a geometry for the discrete array component; and a design tool mode configured to generate a pattern on the PCB associated with a merger of the via pads and discrete array component.

BRIEF DESCRIPTION OF THE DRAWINGS

In order to better understand various exemplary embodiments, reference is made to the accompanying drawings, wherein.

DETAILED DESCRIPTION

Figure 1A:
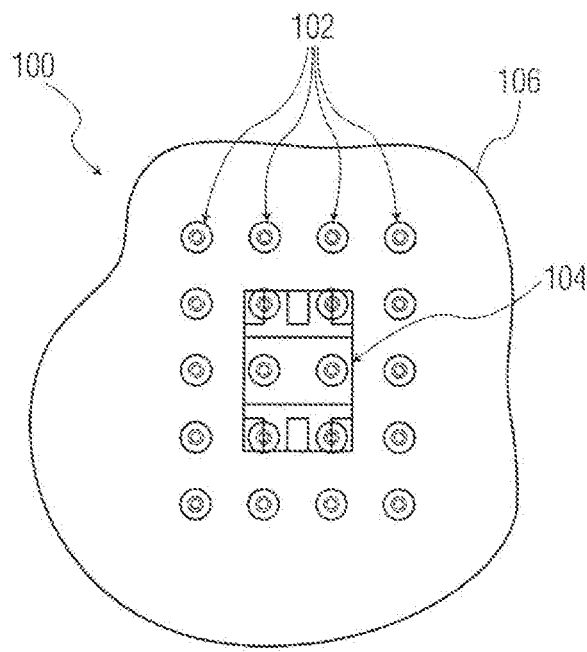
FIG. 1A illustrates an exemplary outline of an array type component on top of a via grid.

The description and drawings presented herein illustrate various principles. It will be appreciated that those skilled in the art will be able to devise various arrangements that, although not explicitly described or shown herein, embody these principles and are included within the scope of this disclosure. As used herein, the term, "or" refers to a non-exclusive or (i.e., and/or), unless otherwise indicated (e.g., "or else" or "or in the alternative"). Additionally, the various embodiments described herein are not necessarily mutually exclusive and may be combined to produce additional embodiments that incorporate the principles described herein. Further, while various exemplary embodiments are described with regard to printed circuit boards (PCB).

Some embodiments include a merger of two different patterns on a PCB to allow the use of array type discrete on the back side of a PCB having a BGA on the directly opposite side. An array type discrete may include, for example, a plurality of resistors or capacitors. Similarly, a variety of both capacitors and resistors may be included on an array type discrete such as two resistors and one capacitor. Similarly, three resistors may be attached to a single array type discrete.

Some components may include Land Grid Arrays (LGA) to connect to a Printed Circuit Board (PCB). Solder paste may be applied in this case to the PCB while the component is placed onto the correct position. The solder paste thereafter holds the component in the correct position. At a later time, a soldering operation may be performed to fix the component to the PCB.

Some components may have pads with pre-attached solder balls such as in ball grid arrays (BGA's), and these may also need to be placed onto the corresponding pads on the PCB. However with BGAs there may be two alternatives—solder paste or flux, which may include solder-paste without the metallic component. Either the solder paste or the flux may stick the component in place until soldering occurs. Flux alone may be used because the solder of the "solder ball" of the BGA may provide enough solder to result in an electrical connection between the component and the PCB. Once the component is soldered onto the board there may be no visibility or access to the pad which hold the solder joints. The pads may be sheltered under the component.

In some or all of the embodiments, the PCB's may be made by the following process:

Through-holes are produced in a circuit board. The holes may be coated with a conductive material, such as copper, producing a via barrel. Other via construction methods are recognized by those skilled in the art.

Adjacent vias may be entirely covered with etch resist. Etch resist may be a thin layer of a nonconductive polymer which can resist the acids used to remove copper from portions of the PCB. Via pads, via barrels and through-holes may be seen after etching is complete and etch resist is removed. Component pads and solder mask may also be visible. Solder mask may be a thin layer of a nonconductive polymer. Solder mask may prevent the copper portions of the via from oxidizing and prevents unintended solder bridges from accidentally forming on the circuit board. Solder mask may be applied using a silkscreen process. Solder paste may then be applied to a component pad within the boundaries of solder mask.

A portion of solder mask corresponding to a component landing area on a component pad may then be removed. This may be accomplished by etching the solder mask to remove material. In an exemplary embodiment solder mask may be modified using photolithography. However, other processes may be used to remove a portion of solder the mask. Solder paste may be applied to a component pad within the boundaries of the removed portion of solder mask.

A component may be attached to a component pad using reflowed solder paste. Solder mask may act as a part of a barrier between the via pad and component pad, preventing solder bridging from occurring during the attachment process.

Referring now to the drawings, in which like numerals refer to like components or steps, there are disclosed broad aspects of various exemplary embodiments.

FIG. 1A illustrates an exemplary outline of an array type component on top of a via grid 100 on a PCB 106. FIG. 1A may include vias 102 in a grid pattern and array type component 104.

Some embodiments include a merger of two different structures on a PCB 106 to allow the use of array type discretes on the back side of a PCB having a BGA on the directly opposite side. The first structure includes the vias 102 which may belong to the part of the BGA grid for the routing of the BGA on the top side. The second structure may be referred to as a copper land pattern for an array type component, as outlined in 104. These two structures did not share the same space in the PCB in prior methods, with the copper land pattern lying outside the BGA grid. In some embodiments, with pinout mapping between the two structures, the merger of the copper structure may be allowed to share the same space on a PCB.

Figure 1B:
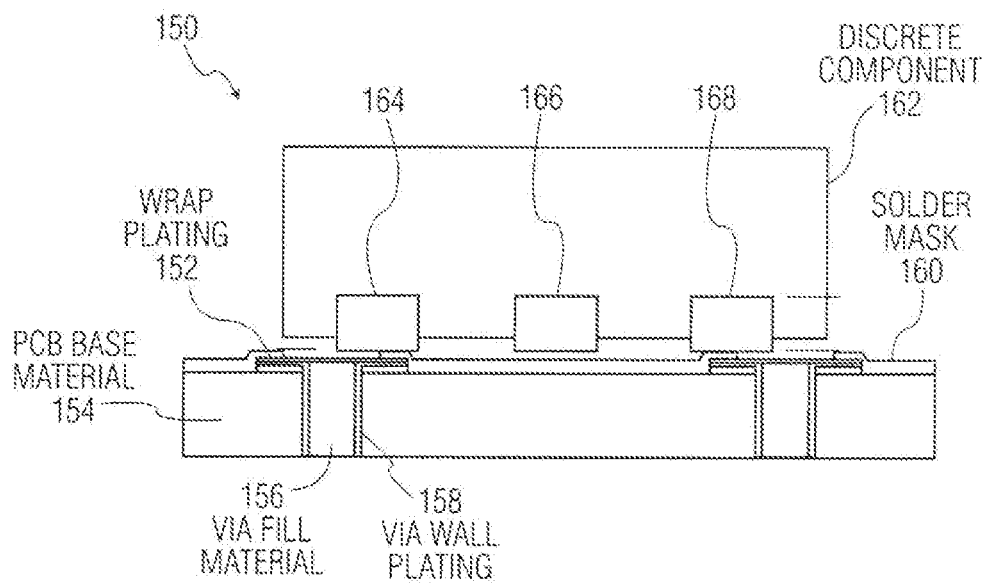
FIG. 1B illustrates exemplary side view of FIG. 1A.

FIG. 1B illustrates exemplary side view of FIG. 1A 150. Exemplary side view 150 may include wrap plating 152, PCB base material 154, via fill material 156, via wall plating 158, solder mask 160, discrete component 162, and pins 164-168. Wrap plating 152 may include an electrolytic hold plating deposition which extends onto the surface of the PCB from a plated via structure. Wrap plating 152 may include copper plating from a hold which wraps around a surface foil.

PCB base material 154 may be any kind of base material such as Teflon, polyimide, FR4 high Tg, CEM1 etc. Via fill material 156 may be, for example, copper plugs, copper plate, surface material, and non-conductive epoxy. Solder mask 160 may be a thin layer of a nonconductive polymer as described above. Solder mask may prevent the copper portions of the via from oxidizing and prevents unintended solder bridges from accidentally forming on the circuit board. Solder mask may be applied using a silkscreen process and be used to cover areas which are not intended to be soldered.

Discrete component 162 may lay on top of the PCB as illustrated. Pins 164-168 may overlap a typical BGA array pattern as illustrated where pin 166 is not immediately above a via. As illustrated in the following figures, the pin mapping of the discrete array component(s) may include any variety of geometry and patterning. For example, the same type of array component may be repeated on the PCB in a repeated pattern. Similarly, different array type components and/or patterning of the component may be overlapped in development of the PCB. For example, use of a two capacitor array component may be repeated multiple times on one PCB. This would account for a similar pattern being repeated. Similarly, a PCB may account for one three resistor component, one two capacitor component and one component with one resistor and one capacitor on it, such that the geometry of the three components on the PCB is not in a fixed pattern.

Figure 2:
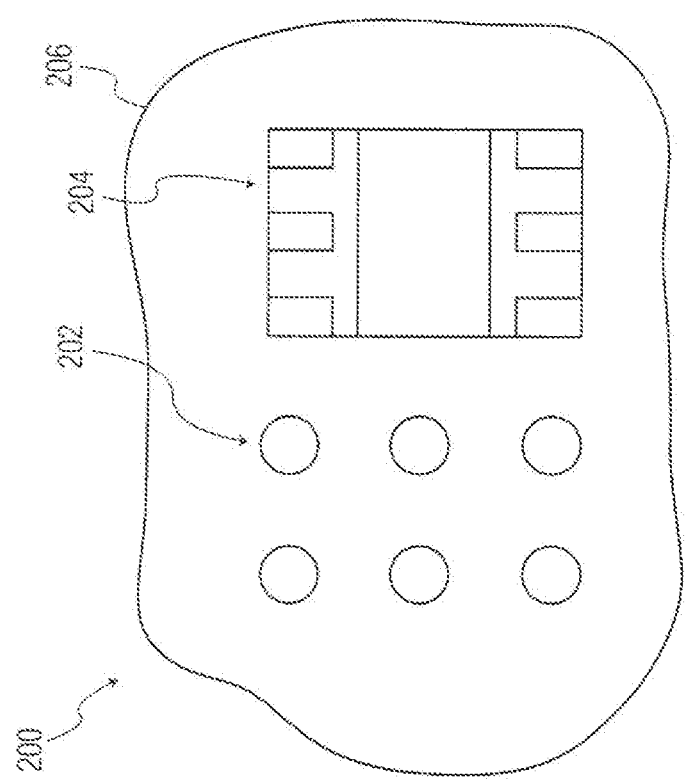
FIG. 2 illustrates exemplary separate copper structures.

FIG. 2 illustrates exemplary separate copper structures 200. Exemplary structures 200 may include copper design vias 202, discrete component copper land pattern 204, and PCB 206. The two independent structures shown in FIG. 2 are designed for the via grid for the BGA which may protrude from both sides of the PCB and for the array type discrete component.

As shown in FIG. 1A, four of the vias of the via grid array may map to the four corner pins of the array type discrete while the two pins in the middle array type discreet may map to two vias as shown and may allow for the grounding of the device. Some embodiments may overlay the design the two copper structures, i.e., the via grid array and the copper land pattern, which under normal circumstances may take up space separately on the PCB 106.

Figure 3:
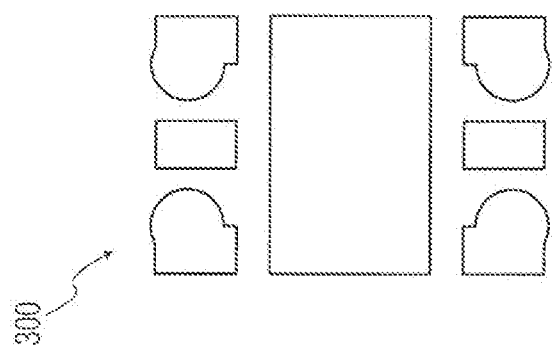
FIG. 3 illustrates an exemplary result of a merged copper pattern between two different structures.

FIG. 3 illustrates an exemplary result of a merged copper pattern between two different copper structures 300. FIG. 3 illustrates the result of the two copper structures of FIG. 2 overlayed on top of each other.

Figure 4:
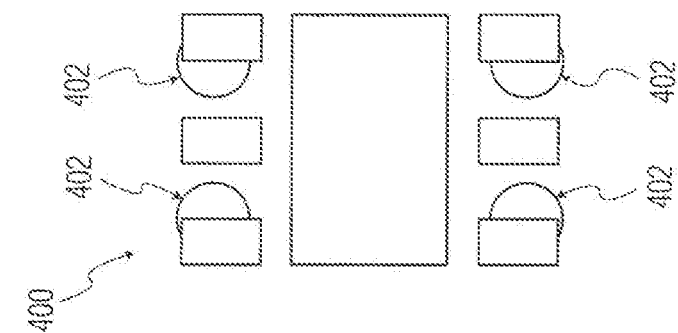
FIG. 4 illustrates an exemplary solder mask application.

FIG. 4 illustrates an exemplary solder mask application 400. Exemplary solder mask application 402 may include solder mask 402. A solder mask 402 may cover an exemplary area which is not intended be soldered. This solder mask 402 may allow an array type discrete component to be put on the back side of a BGA and seeks to minimize the chance of shorts between adjacent copper pads.

Figure 5:
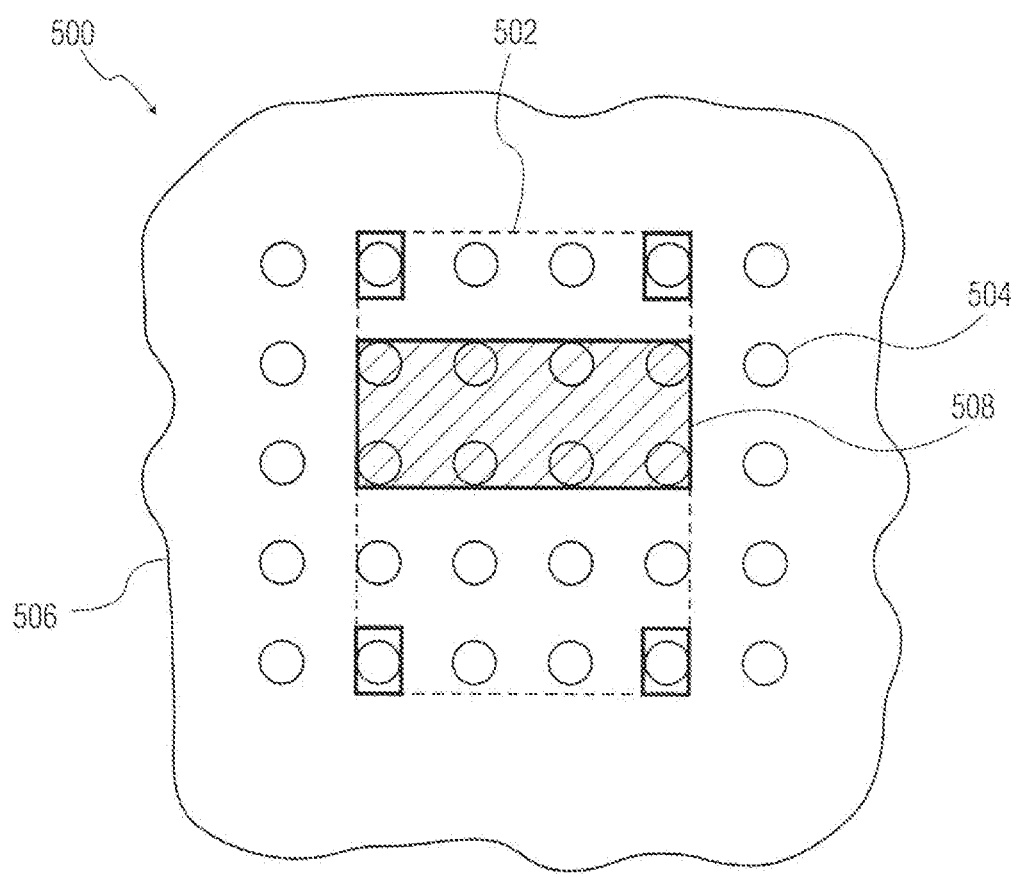
FIG. 5 illustrates an embodiment of a merged copper pattern.

FIG. 5 illustrates an embodiment of a merged copper pattern 500. Embodiment 500 may include merged copper pattern 502, vias 504, and PCB 506. Copper pattern 502 may be spread over a 4×5 via grid as depicted. The copper pattern 502 has four corner pads that align with four corner vias of the 4×5 via grid. Embodiment 500 may also include a middle copper layer 508 which may be spread over a 2×4 layer.

Figure 6:
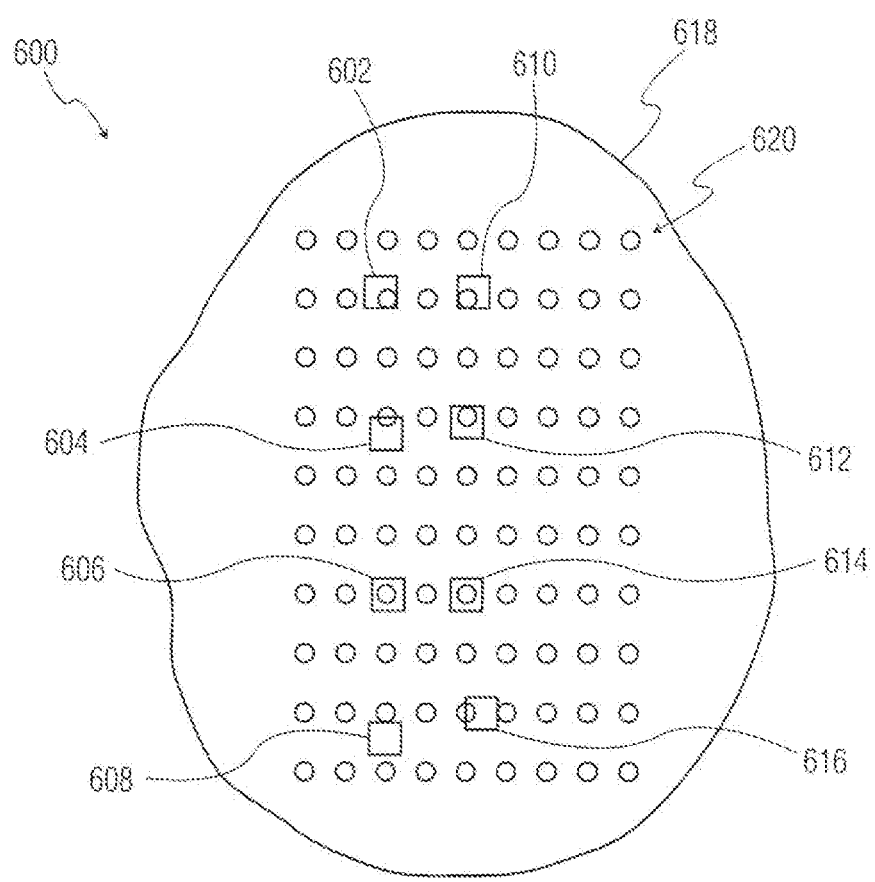
FIG. 6 illustrates an embodiment of a merged copper pattern.

FIG. 6 illustrates another embodiment of a merged copper pattern 600. Embodiment 600 may include pads 602, 604, 606, 608, 610, 612, 614, 616, vias 620, and PCB 618. As is illustrated, the pads may be distributed differently. For example, pads 602 and 610 may be a pair, while pads 604 and 612 may be another pair. The pad pairs may be separated by different amount of vias as illustrated.

Figure 7:
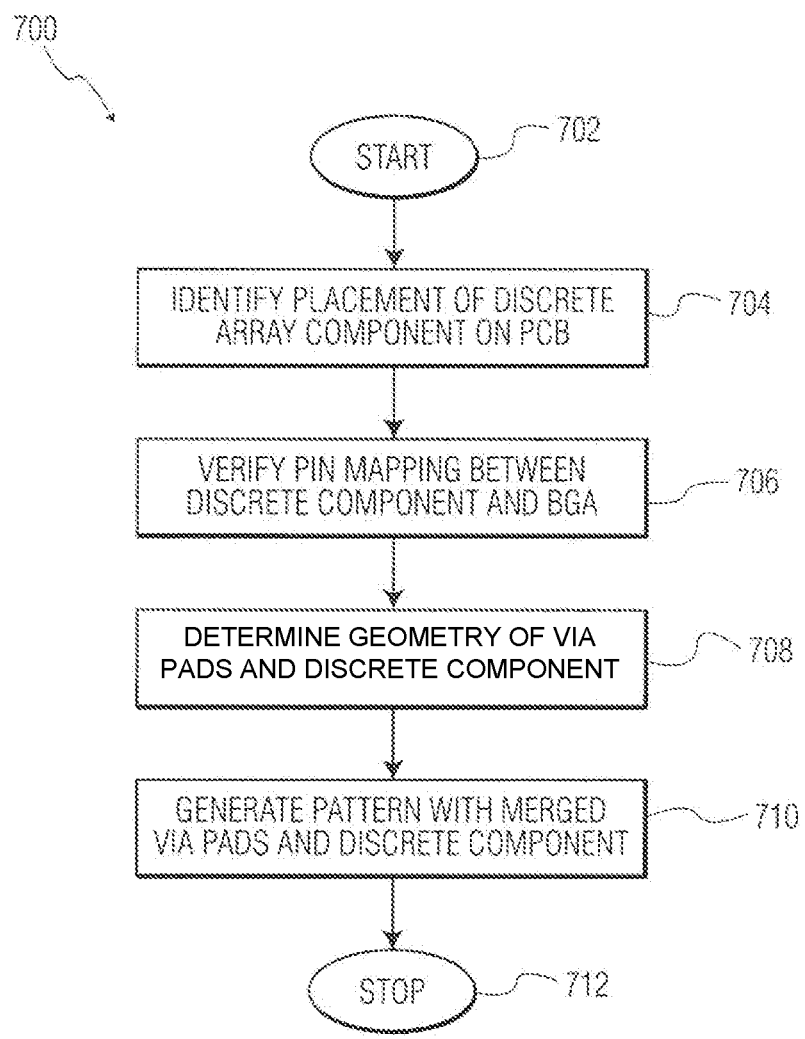
FIG. 7 illustrates an exemplary method of merging copper patterns.

FIG. 7 illustrates an exemplary method of merging copper patterns 700. Method 700 may begin at step 702 where a CAD tool may be used or a PCB may be created by this method. Method 700 may proceed to step 704 where the method may identify the placement of one or more discrete array components on the PCB.

Method 700 may then proceed to step 706 where it may verify the pin mapping between discrete components and the BGA. The discrete component may be made up of any number of components such as capacitors and/or resistors and may have any number of pins. Similarly, the discrete array component may be any size or geometry such as illustrated in FIG. 5-6. The method may then proceed to step 708.

In step 708 the method may determine the geometry of the via pads and discrete component(s). The method may then proceed to step 710. In step 710 the CAD tool or PCB manufacturer may generate one or more patterns which may include the merged via pads and one or more discrete components. In step 710, the generated pattern may be analyzed to determine the portions of the generated pattern to be masked by solder mask. The method may then proceed to step 712 where it may stop.

The pattern generated by the method of merging copper patterns 700 may then be used in a manufacturing process to form such a generated pattern on the via side of the PCB. Then the manufacturing process may mask portions of the formed copper patter using solder mask.

In an exemplary embodiment, a computer aided design (CAD) tool allows the selection of vias and arrangement of the solder mask, component pads, and vias to be substantially automated. The computer aided design tool may automatically identify appropriate spacing and shape of the solder pad so as to allow placement of the surface mount components on the printed circuit board. The CAD tool may also automatically test and merge copper patterns in their design on top of a PCB as described above. A CAD tool may also provide instructions to control a machine to manufacture the modified circuit board. Instructions may be exported to the machine or the design tool may directly control the machine.

The CAD instructions may include any Electronic Design Automation tool or technique. For example, mask data preparation (MDP) may be used such as generation of lithography photomasking which may be used to manufacture a circuit or chip. Resolution enhancement techniques to increase the photomask quality may also be used. Similarly, Optimal Proximity Correction (OPC) for compensation of interference and diffraction may be utilized. Mask generation may also be utilized in the manufacturing. Software systems and versions such as Advanced Design System, Altium Designer, CircuitLogix, CircuitMaker, DesignSpark PCB, Pulsonix, SLED and Micro-Cap may be used or programmed for creation and automation of such circuits.

It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A computer aided design (CAD) tool implemented on a computing device for soldering a discrete array component on a printed circuit board (PCB) for use with mounting a component comprising:
   a design tool mode configured to identify a placement of the discrete array component on the PCB and to verify whether pin mapping between the discrete array component and a ball grid array (BGA) on the opposite side of the PCB is feasible;
   a design tool mode configured to determine the geometry of a design via grid of a set of via pads to be associated with the discrete array component and a geometry for the discrete array component; and
   a design tool mode configured to generate a merged pattern on the PCB associated with a merger of the design via grid of the via pads and a land pattern of the discrete array component sharing a same space on the PCB.

2. The CAD tool of claim 1, wherein the discrete array component is made up of a plurality of components.

3. The CAD tool of claim 2, wherein the plurality of components include resistors, capacitors, diodes, transistors, and other small form factor discrete devices.

4. The CAD tool of claim 1, wherein the discrete array component is made up of a plurality of pins.

5. The CAD tool of claim 1, wherein the discrete array component may be any size or geometry.

6. The CAD tool of claim 1, wherein the pattern is analyzed to determine portions of the generated pattern to be masked by a solder mask.

7. The CAD tool of claim 1, wherein the design tool is used in a manufacturing process to form a generated copper pattern on a via side of the PCB.

8. The CAD tool of claim 7, comprising masking portions of the formed copper pattern using a solder mask.

9. A computer aided design (CAD) tool implemented on a computing device for soldering a discrete array component on a printed circuit board (PCB) for use with mounting a component comprising:
   a design tool configured to allow a selection of a design via grid of vias to be formed and arrangement of a solder mask, component pads, and the selection of vias to be substantially automated, wherein the design tool automatically identifies appropriate spacing and shape of a solder pad to allow placement of surface mount components on one side of the PCB, wherein a ball grid array (BGA) is to be placed on the opposite side of the PCB,
   wherein the design tool automatically tests and merges copper patterns in their design on top of the PCB and wherein the merging is of the design via grid of vias and land patterns of the discrete array component sharing a same space on the PCB.

10. The CAD tool of claim 9, wherein the design tool provides instructions to control a machine to manufacture a modified circuit board.

11. The CAD tool of claim 10, wherein the instructions may be exported to the machine or the design tool may directly control the machine.

\* \* \* \* \*